(12) United States Patent
Zeng et al.

(10) Patent No.: US 12,068,307 B2
(45) Date of Patent: Aug. 20, 2024

(54) TVS DIODE AND ASSEMBLY HAVING ASYMMETRIC BREAKDOWN VOLTAGE

(71) Applicant: Littelfuse Semiconductor (Wuxi) Co., Ltd., Wuxi (CN)

(72) Inventors: Jianfei Zeng, Wuxi (CN); Cai Yingda, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 0 days.

(21) Appl. No.: 18/123,600

(22) Filed: Mar. 20, 2023

(65) Prior Publication Data

US 2023/0230972 A1    Jul. 20, 2023

Related U.S. Application Data

(62) Division of application No. 17/111,690, filed on Dec. 4, 2020, now abandoned.

(30) Foreign Application Priority Data

Dec. 6, 2019   (CN) .......................... 201911243673.9

(51) Int. Cl.
| | | |
|---|---|---|
| *H01L 27/02* | (2006.01) | |
| *H01L 29/66* | (2006.01) | |
| *H01L 29/866* | (2006.01) | |

(52) U.S. Cl.
CPC .... *H01L 27/0255* (2013.01); *H01L 29/66098* (2013.01); *H01L 29/866* (2013.01)

(58) Field of Classification Search
CPC ... H01L 29/866; H01L 29/868; H01L 29/861; H01L 29/872; H01L 29/8725;
(Continued)

(56) References Cited

U.S. PATENT DOCUMENTS

| | | | |
|---|---|---|---|
| 2006/0216913 A1 | 9/2006 | Kung | |
| 2009/0273868 A1* | 11/2009 | Liu | .................... H01L 27/0262 |
| | | | 361/56 |

(Continued)

FOREIGN PATENT DOCUMENTS

| | | | |
|---|---|---|---|
| CN | 109103179 A | 12/2018 | |
| CN | 109390389 A * | 2/2019 | ....... H01L 29/66136 |

(Continued)

OTHER PUBLICATIONS

Wang et al., With Double-side Adjustment Region Of The High Pressure Fast Soft Recovery Diode And Preparation Method Thereof, Feb. 26, 2019, machine translation of CN 109390389 A, pp. 1-5. (Year: 2019).*

(Continued)

*Primary Examiner* — Natalia A Gondarenko
(74) *Attorney, Agent, or Firm* — KDW FIRM PLLC (57) ABSTRACT

In one embodiment, an asymmetric TVS device may include a semiconductor substrate, comprising an inner region, the inner region having a first polarity, and a first surface region, disposed on a first surface of the semiconductor substrate, the first surface region comprising a second polarity, opposite the first polarity. The asymmetric TVS device may also include a second surface region, comprising the second polarity, and disposed on a second surface of the semiconductor substrate, opposite the first surface, wherein the first surface region comprises a first dopant concentration, and wherein the second surface region comprises a second dopant concentration, greater than the first dopant concentration.

18 Claims, 6 Drawing Sheets

(58) Field of Classification Search
CPC ............ H01L 29/0649; H01L 29/0692; H01L 29/0688; H01L 29/6606; H01L 29/66068; H01L 29/66106; H01L 29/882; H01L 29/885; H01L 29/66143; H01L 29/66151; H01L 29/66219; H01L 29/66363; H01L 29/66371; H01L 29/66386; H01L 29/66393; H01L 29/66413; H01L 29/66212; H01L 29/7811; H01L 29/417; H01L 29/404; H01L 29/407; H01L 27/0248; H01L 27/0255; H01L 27/0262; H01L 27/0292; H01L 27/0296; H01L 27/0811; H01L 27/0814; H01L 27/0817; H01L 27/1463; H01L 29/66098; H01L 29/66121; H01L 29/8613; H01L 29/66136; H01L 29/0634; H01L 29/7412; H01L 29/747; H01L 29/7853; H01L 29/8611; H01L 29/0626; H01L 29/0646
USPC ....... 257/143–146, 173, 603, 619, 620, 623, 257/622, 618, 332, 355, 328
See application file for complete search history.

(56) References Cited

U.S. PATENT DOCUMENTS

| | | |
|---|---|---|
| 2014/0284659 A1 | 9/2014 | Wei |
| 2016/0247681 A1* | 8/2016 | Ikeda .................. H01L 21/324 |
| 2016/0293591 A1 | 10/2016 | Bentley |
| 2020/0075780 A1 | 3/2020 | Matocha |

FOREIGN PATENT DOCUMENTS

| | | |
|---|---|---|
| CN | 110112130 A | 8/2019 |
| TW | 201824537 A | 7/2018 |

OTHER PUBLICATIONS

European Search Report mailed Apr. 28, 2021 for corresponding European Patent Application No. 20211999.6.

* cited by examiner

TVS DIODE AND ASSEMBLY HAVING ASYMMETRIC BREAKDOWN VOLTAGE

CROSS REFERENCE TO RELATED APPLICATION

This application is a divisional of U.S. patent application Ser. No. 17/111,690 filed Dec. 4, 2020 which claims the benefit of priority to, Chinese Patent Application No. 201911243673.9, filed Dec. 6, 2019, entitled "TVS Diode And Assembly Having Asymmetric Breakdown Voltage," which application is incorporated herein by reference in its entirety.

BACKGROUND

Field

Embodiments relate to the field of surge protection devices, and more particularly to overvoltage protection devices and resettable fuses.

Discussion of Related Art

Surge protection devices include over-voltage protection devices used to protect components, apparatus, or systems from damage due to over-voltage fault conditions, as well as fuses used to protect components, apparatus or systems from excessive current flow. In the field of overvoltage protection devices, diodes such transient voltage suppressor (TVS) diodes, may be used for a unidirectional TVS is best suited for protecting circuit nodes whose signals are unidirectional or always above or below the reference voltage, usually ground.

In the field of automotive circuits, the requirements for protection may include different breakdown voltage requirements. For example, a jump start requirement may require that voltage be maintained below a certain voltage threshold, while a reverse polarity protection may require voltage not to exceed a different voltage threshold.

With respect to these and other considerations the present disclosure is provided.

SUMMARY

Exemplary embodiments are directed to improved protection devices. In one embodiment, an asymmetric transient voltage suppression (TVS) device is provided. The asymmetric TVS device may include a semiconductor substrate, comprising an inner region, the inner region having a first polarity, and a first surface region, disposed on a first surface of the semiconductor substrate, the first surface region comprising a second polarity, opposite the first polarity. The asymmetric TVS device may also include a second surface region, comprising the second polarity, and disposed on a second surface of the semiconductor substrate, opposite the first surface, wherein the first surface region comprises a first dopant concentration, and wherein the second surface region comprises a second dopant concentration, greater than the first dopant concentration.

In a further embodiment, a method of forming an asymmetric transient voltage suppression (TVS) device is provided. The method may include providing a semiconductor substrate, comprising a first dopant of a first polarity, and defining a first surface and a second surface, opposite the first surface. The method may also include performing a first oxidation process of the semiconductor substrate, wherein a first oxide layer forms on the first surface and a second oxide layer forms on the second surface. The method may further include removing the first oxide layer from at least a first region of the first surface of the semiconductor substrate, and performing a first doping process, wherein the first doping process generates a first surface region on the first surface, having a first concentration of a second dopant of second polarity, opposite the first polarity. The method may additionally include performing a second oxidation process of the semiconductor substrate, wherein a third oxide layer forms over the first region on the first surface, and removing the second oxide layer from at least a second region of the second surface. The method may additionally include performing a second doping process, wherein the second doping process generates a second surface region on the second surface, having a second concentration of a second dopant of second polarity, greater than the first concentration.

In an additional embodiment, an asymmetric transient voltage suppression (TVS) device may include a semiconductor substrate, comprising an inner region, having a first polarity. The semiconductor substrate may include a first surface region, disposed on a first surface of the semiconductor substrate, the first surface region comprising a second polarity; and a second surface region, comprising the second polarity, and disposed on a second surface of the semiconductor substrate, opposite the first surface. As such, the first surface region and the inner region define a first TVS diode having a first polarity, and a first breakdown voltage, wherein the second surface region and the inner region define a second TVS diode having a second polarity, and a second breakdown voltage, greater than the first breakdown voltage.

DESCRIPTION OF EMBODIMENTS

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "either", and/or it may mean "both", although the scope of claimed subject matter is not limited in this respect.

In various embodiments a protection device and assembly are presented for protecting electrical components, systems, or electrical lines, such as communications lines. Various embodiments may include a protection device, arranged as a double sided transient voltage suppression (TVS) diode.

Figure 5:
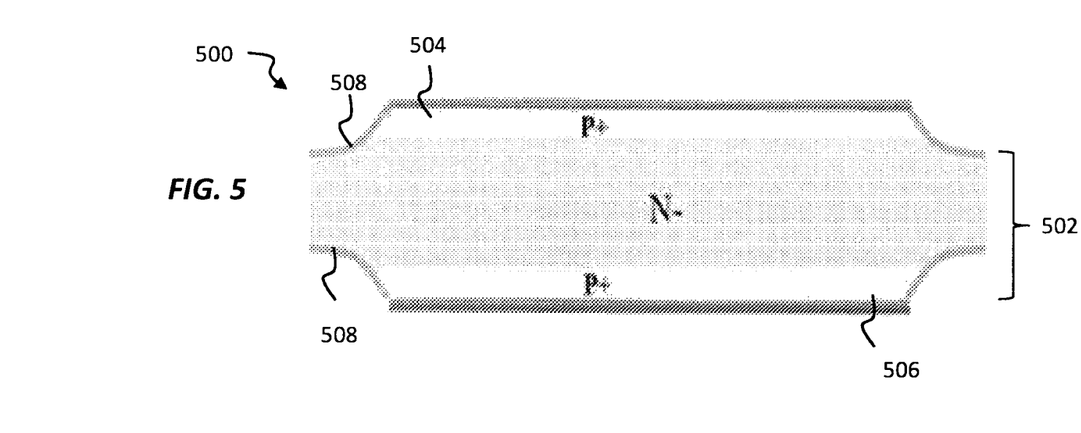
FIG. 5 shows the general structure of a mesa TVS embodiment.
Figure 6:
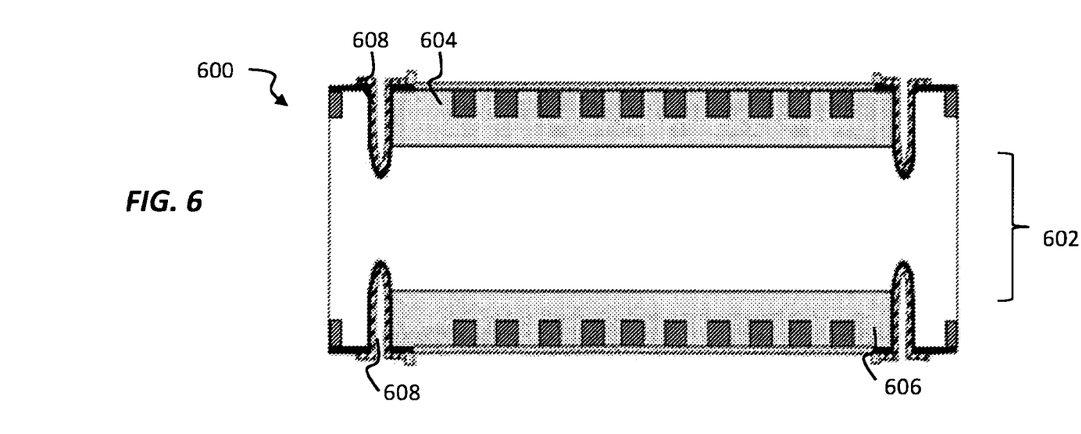
FIG. 6 shows the general structure of a planar TVS embodiment.

Referring to FIG. 5 and FIG. 6, according to the present embodiments, a double sided transient voltage suppression (TVS) diode device may be arranged as a mesa device 500 or a planar device 600. Generally in either device, a monocrystalline substrate such as silicon may be used. As shown in FIG. 5, an inner region 502 of the mesa device 500 may be doped as an N-type region, while a surface region 504, on a first side, may be a P-type region, and a surface region 506, on a second side, may also be a P-type region. As shown in FIG. 6, an inner region 602 of the planar device 600 may be doped with a first dopant, such as an N-type region, while a surface region 604, on a first side, may be doped with a second dopant, so as to form a P-type region, for example, and a surface region 606, on a second side, may also be a P-type region. The isolation structures 508 in the mesa device 500 may be formed differently from the isolation structures 608 in the planar device 600, as is known in the art. As discussed below, in either a double sided mesa TVS device or planar TVS device, the breakdown voltage may be engineered to be different on the different sides, such as by adjusting dopant concentrations in the surface region.

Figure 1:
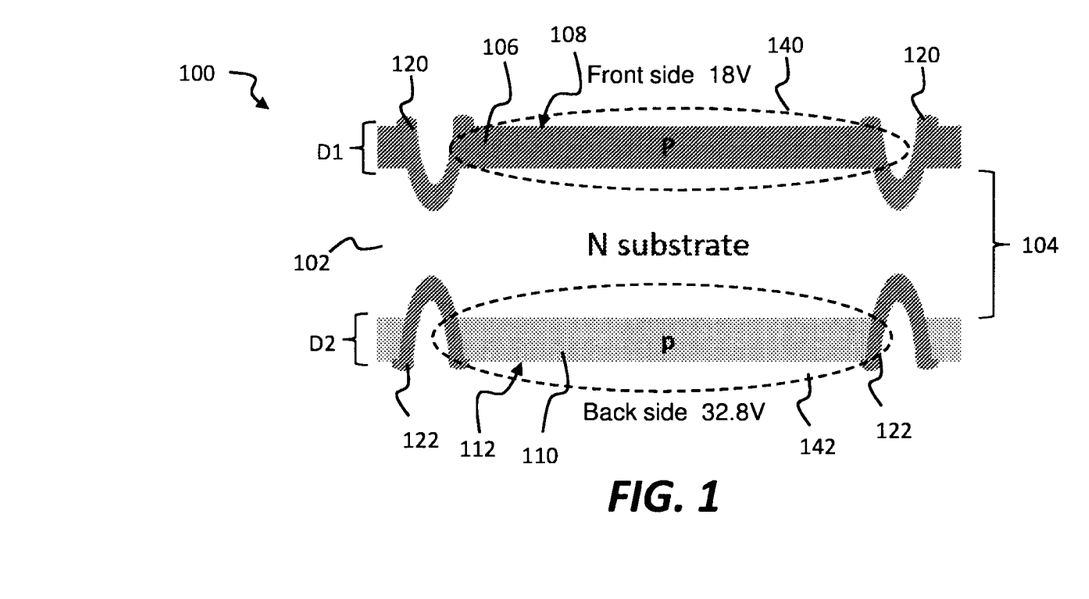
FIG. 1 presents a side cross-sectional view of a protection device, according to various embodiments of the disclosure.

FIG. 1 presents a side cross-sectional view of a protection device 100, according to various embodiments of the disclosure. The protection device 100 may be formed within a substrate 102, such as monocrystalline silicon, or similar suitable semiconductor material. The protection device 100 may include a first TVS diode 140 and a second TVS diode 142, where the first TVS diode 140 and second TVS diode 142 are integrated into a common die, that is, the substrate 102. According to various embodiments of the disclosure, the first TVS diode 140 may be characterized by a first breakdown voltage, while the second TVS diode is characterized by a second breakdown voltage, different from the first breakdown voltage. As such, the protection device 100 may form an asymmetric TVS device, characterized by two different breakdown voltages for voltage surges of opposite polarity.

According to various embodiments of the disclosure, the protection device 100 includes an inner region 104, where the inner region 104 has a first polarity, such as an N-type polarity. The protection device 100 further may include a first surface region 106, disposed on a first surface 108 of the substrate 102, where the first surface region 106 comprises a second polarity, such as a p-type polarity. The protection device 100 may also include a second surface region 110, comprising the second polarity, and disposed on a second surface 112 of the substrate 102, opposite the first surface 108. In particular, as shown in FIG. 1, the inner region 104 and first surface region 106 comprise a first TVS diode 140, having a first breakdown voltage, while the inner region 104 and the second surface region 110 comprise a second TVS diode 142 of opposite polarity to the first TVS diode 140, and having a second breakdown voltage, different from the first breakdown voltage.

According to some non-limiting embodiments, the first breakdown voltage may be in the range of 15 V-20V, and the second breakdown voltage being in the range of 30 V to 35 V. In particular embodiments, the first breakdown voltage may be approximately 18 V and the second breakdown voltage may be approximately 33V.

Of course, other voltage ranges may be used depending upon the application. In order to generate different breakdown voltages for the first TVS diode 140 and the second TVS diode 142, the first surface region 106 may have a first dopant concentration, while the second surface region 110 may have a second dopant concentration, greater than the first dopant concentration. In various embodiments, the first dopant concentration may be in a suitable concentration range to generate a breakdown voltage of approximately 15 V-20 V, which concentration range will depend upon doping level of the inner region of the substrate. Similarly the second dopant concentration may be in a suitable concentration range to generate a breakdown voltage of approximately 30 V-35 V, which concentration range will depend upon doping level of the inner region of the substrate. In one non-limiting example, the concentration one P-type layer have exhibit a maximum dopant concentration of $2E19/cm^3$ and may exhibit a relatively deeper junction depth, generating a relatively higher breakdown voltage, while the other P-type layer may exhibit a maximum dopant concentration of $8E19/cm^3$ and may exhibit a relatively shallower junction depth, generating a relatively lower breakdown voltage.

Generally, as will be appreciated by those of ordinary skill in the art, the first dopant concentration and second dopant concentration may be tailored to generate a targeted breakdown voltage for the first TVS diode and the second TVS diode, also taking into account the dopant concentration of the inner region 104.

In a given substrate, such as substrate 102, a given diode may be defined as a planar diode where the area of the planar diode may be defined by electrical isolation components, such as isolation trenches 120, disposed on the first surface 108, and isolation trenches 122, disposed on the second surface 112. According to various embodiments of the disclosure, the first surface region 106 may have a first surface area, where the second surface region 110 has a second surface area, the same as the first surface area.

FIG. 2A-2I depict exemplary stages of synthesis of a protection device, according to embodiments of the disclosure. At FIG. 2A, a substrate 102 is provided, such as a monocrystalline silicon substrate. The embodiments are not limited in this context, however. The substrate 102 may be doped according to a targeted dopant polarity, such as N-type dopant, and a targeted level of dopant concentration. At FIG. 2B, the substrate 102 is shown after an oxidation process has been performed to form an oxide layer 150. In various embodiments, the oxide layer 150 may be formed on the first surface 108 and the second surface 112.

Figure 2A:
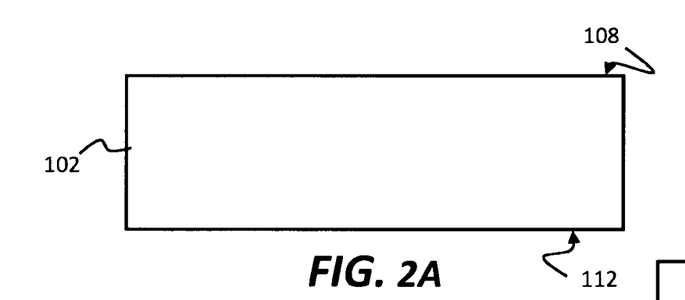
FIG. 2A-2I depict exemplary stages of synthesis of a protection device, according to embodiments of the disclosure.
Figure 2B:
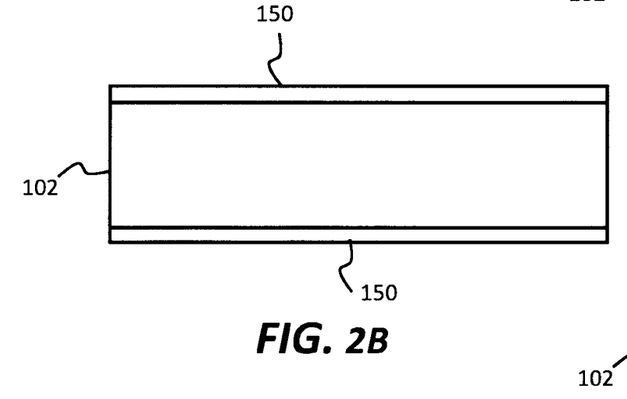
Figure 2C:
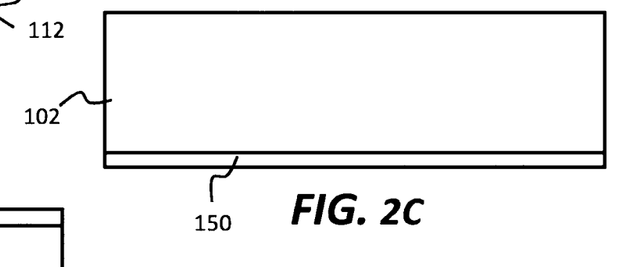

At FIG. 2C a subsequent stage is shown, where the oxide layer 150 has been removed from the first surface 108. The oxide layer 150 may be removed from an entirety of the first surface 108 or just part of the first surface 108 in different embodiments. At FIG. 2D, a subsequent stage is shown where a dopant layer 152 is formed on the first surface 108. The dopant layer 152 may generally have opposite polarity to the polarity of the substrate 102.

Figure 2D:
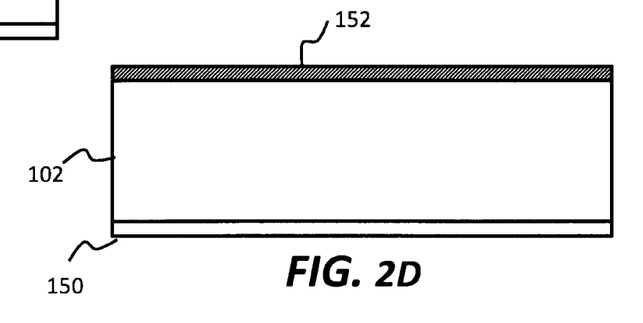
Figure 2E:
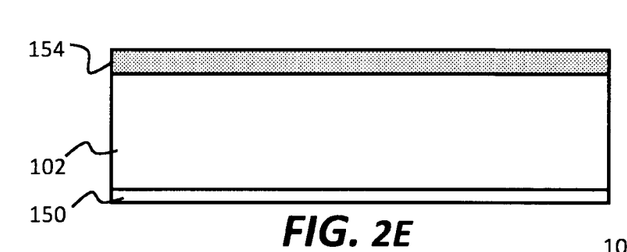

At FIG. 2E, a subsequent instance is shown where a first surface region 154 has been formed. The first surface region 154 may be formed of a dopant of a polarity, opposite the polarity of the substrate 102, such as a P-type polarity. The first surface region 154 may be formed by performing a drive in anneal to drive dopants of the dopant layer 152 into the substrate 102. As such, the layer thickness of the first surface region 154 (see D1 of FIG. 1) may in part be determined by the layer thickness of the dopant layer 152, as well as the annealing protocol (annealing temperature(s), annealing time(s)) for the drive-in anneal. In addition, the dopant concentration of the first surface region 154 may be determined by the layer thickness of the dopant layer 152, or total amount of dopant in the dopant layer 152, as well as the annealing protocol for the drive-in anneal.

While the operations in FIG. 2D and FIG. 2E do not explicitly depict formation of a dopant layer on the second surface 112, in some embodiments, the formation of a dopant layer 152 may employ a process where at least some dopant may deposit on the lower surface side. However, the lower surface side is protected by the oxide layer 150, preventing dopant from being driven in to the substrate 102 from the second surface 112.

Figure 2F:
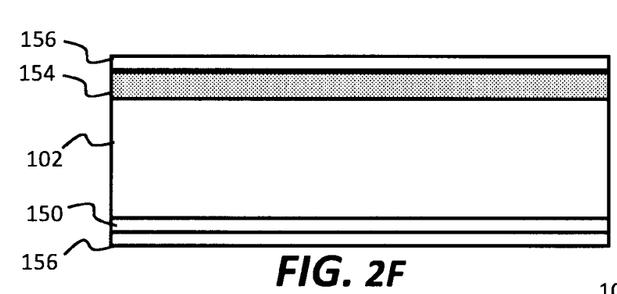
Figure 2G:
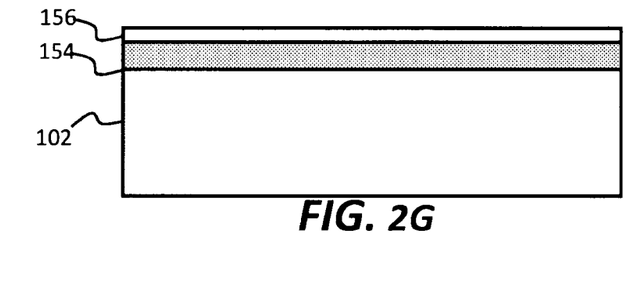

At FIG. 2F, a second oxide layer 156 has been formed on the substrate 102. The second oxide layer 156 may cover the first surface region 154, as shown. At FIG. 2G, a subsequent operation is shown, where oxide is removed from the second surface 112, such as oxide layer 150 and second oxide layer 156.

Figure 2H:
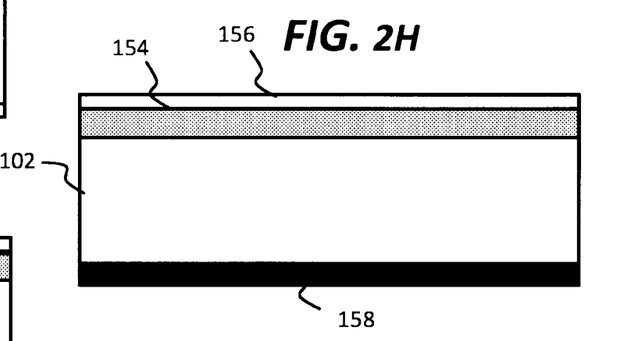

At FIG. 2H, a subsequent instance is shown where a second dopant layer 158 has been deposited on the second surface 112.

Figure 2I:
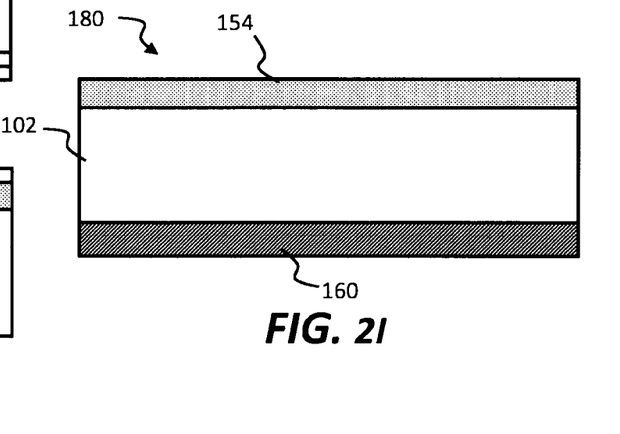

At FIG. 2I, a subsequent instance is shown where a second surface region 160 has been formed. The second surface region 160 may be formed of a dopant of a polarity, opposite the polarity of the substrate 102, such as a P-type polarity. The second surface region 160 may be formed by performing a drive in anneal to drive dopants of the dopant layer 158 into the substrate 102. As such, the layer thickness of the second surface region 160 (see D2 of FIG. 1) may in part be determined by the thickness of the dopant layer 158, as well as the annealing protocol (annealing temperature(s), annealing time(s)) for the drive-in anneal. In addition, the dopant concentration of the second surface region 160 may be determined by the thickness of the dopant layer 158, or total amount of dopant in the dopant layer 158, as well as the annealing protocol for the drive-in anneal. In the instance of FIG. 2I, the second oxide layer 156 has also been removed from the first surface 108, forming a device 180, with asymmetric breakdown voltage. One non-limiting example of a suitable annealing procedure to form a surface region of P-type polarity (either for a relatively high voltage layer or relatively lower voltage layer) involves annealing at 1150 C for four hours in a gas atmosphere. The nitrogen flow may be 28 SLPM (standard liters per minute), with $O_2$ at 70 standard cubic centimeters per minute (sccm). A $BBr_3$ material may be used as a doping source, flowing at 380 sccm. Notably, the higher voltage layer may need to be generated firstly. In addition, the basic annealing procedure outlined above may be varied slightly to generate the different dopant concentrations, for example, the $N_2$, $O_2$, source gas volume may be adjusted to be different to produce a different dopant concentration, and therefore different breakdown voltage.

Figure 3:
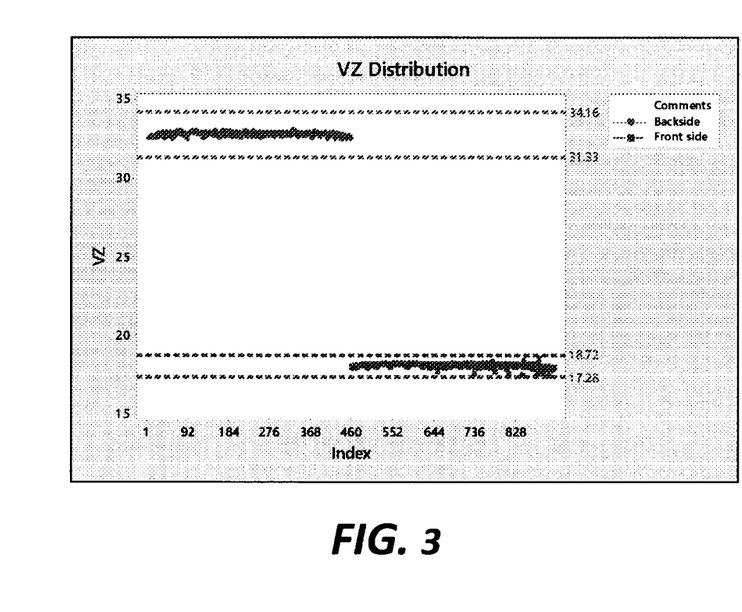
FIG. 3 provides exemplary breakdown voltage data.

In particular embodiments an asymmetric TVS diode device may be arranged with breakdown voltages suitable for automotive applications. As an example, a first diode, formed on a first surface of a silicon die, may be arranged with a breakdown voltage in the range of 32.8 V, while a second diode, arranged on the second surface of the silicon die is arranged with a breakdown voltage of 18 V. FIG. 3 illustrates breakdown voltage behavior for semiconductor die arranged according to the aforementioned embodiments, with opposing diodes having a nominal breakdown voltage of 32.8 V and 18 V. As shown, multiple die measurements illustrate a uniform breakdown voltage values for both diodes. Moreover, the surge capability is also found to meet product specifications for this set of die.

In this example, one P-type layer has a peak dopant concentration of approximately $8E19/cm^3$ and extends to less than 30 mm thickness, while the other P-type layer has a peak dopant concentration of approximately $2E19/cm^3$ and extends to a greater thickness (depth).

Figure 4:
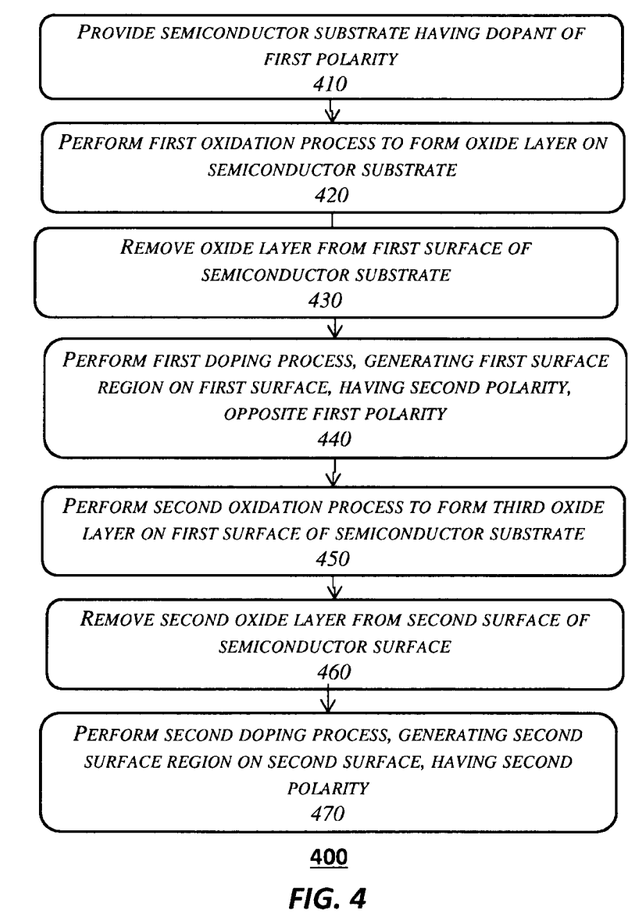
FIG. 4 depicts an exemplary process flow.

FIG. 4 depicts a process flow 400, according to embodiments of the disclosure. At block 410, a semiconductor substrate is provided, such as a silicon substrate. The semiconductor substrate may be doped at a suitable doping concentration for forming a breakdown diode. As an example, the semiconductor substrate may be doped to have an N-type polarity. In one example, the doping level may be such that both two polarity doping range yields a sheet resistance of 1.0-1.5 ohm/sq.

At block 420, a first oxidation process is performed to form an oxide layer on the semiconductor substrate. The first oxidation process may be performed by any suitable method, and in some examples may form an oxide layer on a first surface and second surface of the semiconductor substrate.

At block 430 a first oxide layer is removed from the first surface of the semiconductor substrate, if present. In some examples, where the first oxide layer initially coats an entirety of the first surface, the first oxide layer is removed from all or at least a portion of the first surface.

At block 440 a first doping process is performed, to generate a first surface region on the first surface. As such, the first surface region is formed with a second polarity, opposite the first polarity of the substrate. In some embodiments, a suitable dopant concentration for a P-type surface region is in the range of $2E20/cm^3$ or somewhat less.

At block 450, a second oxidation process is performed to form a third oxide layer on the first surface of the semiconductor substrate. The second oxidation process may be performed by any suitable method, and in some examples may form an oxide layer on the second oxide layer, already present on the second surface of the semiconductor substrate.

At block 460 the second oxide layer is removed from the second surface of the semiconductor substrate. To the extent that the third oxide layer is present on the second oxide layer, the third oxide layer is also removed from the second surface.

At block 470, a second doping process is performed, to generate a second surface region on the second surface, having a second polarity. According to various embodiments, the second doping process differs from the first doping process in that the first surface region differs from the second surface region in concentration of dopant species of the second polarity. The depth of the first surface region may also differ from the depth of the second surface region according to some embodiments. As such, the first surface region and the second surface region may generate, in conjunction with the semiconductor substrate, two different TVS diodes, characterized by different breakdown voltages.

While the present embodiments have been disclosed with reference to certain embodiments, numerous modifications, alterations and changes to the described embodiments are possible without departing from the sphere and scope of the present disclosure, as defined in the appended claims. Accordingly, it is intended that the present embodiments not be limited to the described embodiments, and that it has the full scope defined by the language of the following claims, and equivalents thereof.

What is claimed is:

1. A method of forming an asymmetric transient voltage suppression (TVS) device, comprising:
   providing a semiconductor substrate, the semiconductor substrate comprising a first dopant of a first polarity, and defining a first surface and a second surface, opposite the first surface;
   performing a first oxidation process of the semiconductor substrate, wherein a first oxide layer forms on the first surface and a second oxide layer forms on the second surface;
   removing the first oxide layer from at least a first region of the first surface of the semiconductor substrate, while not removing the second oxide layer from the second surface;
   performing a first doping process, wherein the first doping process generates a first surface region on the first surface, having a first concentration of a second dopant of second polarity, opposite the first polarity;
   performing a second oxidation process of the semiconductor substrate, wherein a third oxide layer forms over the first region on the first surface and wherein a fourth oxide layer forms over the second oxide layer;
   removing the second oxide layer and the fourth oxide layer from at least a second region of the second surface while not removing the third oxide layer from the first surface; and
   performing a second doping process, wherein the second doping process generates a second surface region on the second surface, having a second concentration of the second dopant of the second polarity, greater than the first concentration.

2. The method of claim 1, wherein the semiconductor substrate comprises an n-type polarity, and wherein the first surface region and the second surface region comprise a p-type polarity.

3. The method of claim 2, wherein the semiconductor substrate comprises an n-type inner region, characterized by the n-type polarity, after the performing the first doping process and the performing the second doping process.

4. The method of claim 3, wherein the n-type inner region and first surface region comprise a first TVS diode, having a first breakdown voltage, and wherein the n-type inner region and the second surface region comprise a second TVS diode of opposite polarity to the first TVS diode, and having a second breakdown voltage, different from the first breakdown voltage.

5. The method of claim 4, the first breakdown voltage being in a range of 15 V to 20 V, and the second breakdown voltage being in a range of 30 V to 35 V.

6. The method of claim 1, the first dopant concentration comprising a range of $8E19/cm^3$, and the second dopant concentration comprising a range of $2E19/cm^3$.

7. The method of claim 1, the first surface region comprising a first surface area, and the second surface region comprising a second surface area, the same as the first surface area.

8. The method of claim 7, wherein the performing the first doping process comprises depositing a first dopant layer, having a first layer thickness, and performing a first drive-in anneal, and wherein the performing the second doping process comprises depositing a second dopant layer, having a second layer thickness, and performing a second drive-in anneal.

9. The method of claim 8, wherein the first layer thickness is different from the second layer thickness.

10. The method of claim 8, wherein the first drive-in anneal is different from the second drive in anneal.

11. A method of forming an asymmetric transient voltage suppression (TVS) device, comprising:
    providing a semiconductor substrate, the semiconductor substrate comprising a first dopant of a first polarity, and defining a first surface and a second surface, opposite the first surface;
    performing a first oxidation process of the semiconductor substrate, wherein a first oxide layer forms on the first surface and a second oxide layer forms on the second surface;
    removing the first oxide layer from at least a first region of the first surface of the semiconductor substrate while maintaining the second oxide layer;
    depositing a first dopant layer of a dopant of a second polarity, opposite the first polarity, on the first surface, the first dopant layer having a first layer thickness, wherein the first dopant layer forms on the second oxide layer during the performing the first doping process;
    performing a first drive-in anneal after the depositing the first dopant layer;
    performing a second oxidation process of the semiconductor substrate, after the performing the first drive in anneal, wherein a third oxide layer forms over the first region on the first surface and wherein a fourth oxide layer forms over the second oxide layer;
    removing the second oxide layer, the first dopant layer and the fourth oxide layer from at least a second region of the second surface, while maintaining the third oxide layer; and
    depositing a second dopant layer of the dopant of the second polarity on the second surface, the second dopant layer having a second layer thickness; and
    performing a second drive-in in anneal after the depositing the second dopant layer.

12. The method of claim 11, wherein a first surface region is generated on the first surface, having a first concentration of the dopant of the second polarity, and wherein a second surface region is generated on the second surface, having a second concentration of the dopant of the second polarity, greater than the first concentration.

13. The method of claim 12, wherein an inner region of the semiconductor substrate and the first surface region comprise a first TVS diode, having a first breakdown voltage, and wherein the inner region and the second surface region comprise a second TVS diode of opposite polarity to the first TVS diode, and having a second breakdown voltage, different from the first breakdown voltage.

14. The method of claim 12, wherein the semiconductor substrate comprises an n-type polarity, and wherein the first surface region and the second surface region comprise a p-type polarity.

15. The method of claim 14, wherein the semiconductor substrate comprises an n-type inner region, characterized by the n-type polarity, after the performing the first doping process and the performing the second doping process.

16. The method of claim 11, wherein the first layer thickness is different from the second layer thickness.

17. The method of claim 11, wherein the first drive-in anneal is different from the second drive-in anneal.

18. The method of claim 11, the second dopant concentration comprising $8E19/cm^3$, and the first dopant concentration comprising $2E19/cm^3$.

\* \* \* \* \*